(12) United States Patent
Kim et al.

(10) Patent No.: US 9,538,681 B2
(45) Date of Patent: Jan. 3, 2017

(54) MOBILE TERMINAL

(71) Applicant: LG ELECTRONICS INC., Seoul (KR)

(72) Inventors: Hansu Kim, Seoul (KR); Hyunsuk Yang, Seoul (KR); Minsoo Kim, Seoul (KR); Jaichul Kim, Seoul (KR); Sanghee Nam, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 86 days.

(21) Appl. No.: 14/163,556

(22) Filed: Jan. 24, 2014

(65) Prior Publication Data

US 2014/0268623 A1 Sep. 18, 2014

(30) Foreign Application Priority Data

Mar. 18, 2013 (KR) .................. 10-2013-0028424

(51) Int. Cl.
*H05K 7/14* (2006.01)
*H04M 1/02* (2006.01)

(52) U.S. Cl.
CPC ............. *H05K 7/14* (2013.01); *H04M 1/0249* (2013.01); *H04M 1/0266* (2013.01)

(58) Field of Classification Search
CPC .... G06F 1/1601; G06F 1/1607; G06F 1/1613; G06F 1/1616; G06F 1/1626; G06F 1/1633; G06F 1/1637; G06F 1/1641; G06F 1/1656; H05K 7/14; H04M 1/0249; H04M 1/0266
USPC ............ 361/679.02, 679.21, 679.22, 679.26, 361/679.27, 679.29, 679.3, 679.56, 752, 361/681, 682, 683; 345/173; 455/575.7, 455/575.1–575.5, 550.1, 347
See application file for complete search history.

(56) References Cited

U.S. PATENT DOCUMENTS

| | | | |
|---|---|---|---|
| 6,262,887 B1* | 7/2001 | Lee ........................ | 361/679.27 |
| 2004/0114062 A1* | 6/2004 | Nishio ............. | G02F 1/133308 349/58 |
| 2004/0135936 A1* | 7/2004 | Lee ..................... | G02B 6/0043 349/64 |
| 2005/0285991 A1* | 12/2005 | Yamazaki ......... | G02F 1/133308 349/58 |
| 2006/0181841 A1* | 8/2006 | Chen ................. | H04M 1/0266 361/679.3 |

(Continued)

FOREIGN PATENT DOCUMENTS

| | | |
|---|---|---|
| CN | 101647262 A | 2/2010 |
| CN | 102404423 A | 4/2012 |

(Continued)

*Primary Examiner* — Courtney Smith
*Assistant Examiner* — Sagar Shrestha
(74) *Attorney, Agent, or Firm* — Birch, Stewart, Kolasch & Birch, LLP

(57) ABSTRACT

Disclosed is a mobile terminal, comprising: a display; a metal frame coupled to a rear surface of the display by an adhesive tape, and having a screw-coupling groove on a rear surface thereof; a front case coupled to the rear surface of the metal frame, and having a screw-coupling hole; a screw inserted into the screw-coupling groove and the screw-coupling hole on a rear surface of the front case; and a rear case coupled to the front case, and configured to cover the rear surface of the metal frame. Under such configuration, the rear surface of the display is coupled to the case. Accordingly, the size of a bezel portion disposed on a side surface of the mobile terminal can be prevented from increasing, and a display panel can be easily separated from the front case.

14 Claims, 7 Drawing Sheets

(56) References Cited

U.S. PATENT DOCUMENTS

| | | | |
|---|---|---|---|
| 2007/0012489 A1* | 1/2007 | Kim | G06F 1/1624 178/18.01 |
| 2009/0247236 A1 | 10/2009 | Kajiwara et al. | |
| 2009/0257189 A1* | 10/2009 | Wang | H04M 1/0249 361/679.56 |
| 2010/0029349 A1* | 2/2010 | Ogatsu | H04M 1/0237 455/575.4 |
| 2010/0327737 A1* | 12/2010 | Hayashi | B60Q 3/0253 313/504 |
| 2011/0095975 A1* | 4/2011 | Hwang | G06F 1/1626 345/156 |
| 2012/0176737 A1* | 7/2012 | Kim | G02F 1/133308 361/679.01 |
| 2012/0229989 A1 | 9/2012 | Wu | |
| 2012/0329528 A1* | 12/2012 | Song | H04M 1/0268 455/566 |
| 2013/0038809 A1* | 2/2013 | Hung | G02F 1/133308 349/58 |
| 2013/0162506 A1* | 6/2013 | Kim | G06F 1/32 345/82 |
| 2013/0169575 A1* | 7/2013 | Masuda | G06F 3/041 345/173 |
| 2013/0222298 A1* | 8/2013 | Kato | G06F 3/01 345/173 |
| 2014/0055916 A1* | 2/2014 | Gu | H05K 7/00 361/679.01 |
| 2014/0085779 A1* | 3/2014 | Delva | G02F 1/133308 361/679.01 |
| 2014/0126227 A1* | 5/2014 | Yoon | G09F 9/301 362/382 |
| 2015/0042898 A1* | 2/2015 | Ikuta | G02F 1/133308 348/790 |

FOREIGN PATENT DOCUMENTS

| | | | | |
|---|---|---|---|---|
| CN | 102841699 A | 12/2012 | | |
| EP | 1 912 417 A2 | 4/2008 | | |
| NL | WO 2011/135478 | * 11/2011 | | G02F 1/13 |

* cited by examiner

MOBILE TERMINAL

CROSS-REFERENCE TO RELATED APPLICATION

Pursuant to 35 U.S.C. §119(a), this application claims the benefit of earlier filing date and right of priority to Korean Application No. 10-2013-0028424, filed on Mar. 18, 2013, the contents of which is incorporated by reference herein in its entirety.

BACKGROUND OF THE DISCLOSURE

1. Field of the Disclosure

The present disclosure relates to a mobile terminal, and particularly, to a mobile terminal having a structure where a display module is mounted to a case.

2. Background of the Disclosure

In general, a terminal may be classified into a mobile (portable) terminal and a stationary terminal according to a moveable state. The mobile terminal may be also classified into a handheld terminal and a vehicle mount terminal according to a user's carriage method.

As functions of the terminal become more diversified, the terminal can support more complicated functions such as capturing images or video, reproducing music or video files, playing games, receiving broadcast signals, and the like. By comprehensively and collectively implementing such functions, the mobile terminal may be embodied in the form of a multimedia player or a device.

As the mobile terminal is provided with diversified functions, a display is considered as a main component and the mobile terminal has a larger screen. However, as the size of the display increases, the size of the mobile terminal also increases. In order to solve such problem, required is a new design capable of increasing the size of the display while minimizing the size of the mobile terminal.

SUMMARY OF THE DISCLOSURE

Therefore, an aspect of the detailed description is to provide a mobile terminal capable of reducing the size of a bezel portion disposed on a side surface of the mobile terminal, and capable of easily separating a display from a case during a repair process of the mobile terminal.

To achieve these and other advantages and in accordance with the purpose of this specification, as embodied and broadly described herein, there is provided a mobile terminal, comprising: a display; a metal frame coupled to a rear surface of the display by an adhesive tape, and having a screw-coupling groove on a rear surface thereof; a front case coupled to the rear surface of the metal frame, and having a screw-coupling hole; a screw inserted into the screw-coupling groove and the screw-coupling hole on a rear surface of the front case; and a rear case coupled to the front case, and configured to cover the rear surface of the metal frame.

The metal frame may further comprise a boss portion protruding from a circumferential surface of the screw-coupling groove toward the rear surface of the metal frame, and the boss portion inserted into the screw-coupling hole of the front case.

The metal frame may be provided with an opening at a central part thereof. A graphite sheet may be inserted into the opening of the metal frame.

The front case may be provided with a protruding portion having a front surface protruding in correspondence to a shape of the opening, and a concaved rear surface. The protruding portion may be inserted into the opening.

The adhesive tape may not be attached to an edge region of the display.

The metal frame may be formed as at least one corner thereof is cut-out.

A concaved portion may partially protrude from an edge region of the front case toward a front surface of the front case.

Part of the metal frame corresponding to the concaved portion may be removed.

The screw-coupling hole and the screw-coupling groove may be formed along an edge region of the display.

A printed circuit board may be disposed between the front case and the rear case. The metal frame may be electrically connected to the display partially or is wholly, and may be electrically connected to a grounding portion of the printed circuit board.

The display may be configured as an organic light emitting diode (OLED).

The display may be bent in the form of a curved line, and the front case, the rear case and the metal frame may be bent in correspondence to the shape of the display.

According to another aspect of the present invention, there is provided a mobile terminal, comprising: a terminal body; a display configured to output visual information to a front surface of the terminal body; a frame coupled to a rear surface of the display, and integrated with the display by adhesion; and a case forming an appearance of the terminal body partially or wholly, and to which the frame is detachably coupled such that the display is fixed to or separated from the case.

Further scope of applicability of the present application will become more apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the detailed description.

BRIEF DESCRIPTION OF THE DRAWINGS

The accompanying drawings, which are included to provide a further understanding of the disclosure and are incorporated in and constitute a part of is this specification, illustrate exemplary embodiments and together with the description serve to explain the principles of the disclosure.

In the drawings.

DETAILED DESCRIPTION OF THE DISCLOSURE

Hereinafter, a mobile terminal of the present disclosure will be explained in more detail with reference to the attached drawings. The suffixes attached to components of the wireless speaker, such as 'module' and 'unit or portion' were used for facilitation of the detailed description of the present invention. Therefore, the suffixes do not have different meanings from each other.

The mobile terminal according to the present invention may include a smart phone, a laptop computer, a digital broadcasting terminal, a Personal Digital Assistant (PDA), a Portable Multimedia Player (PMP), a navigation system, etc.

However, it will be obvious to those skilled in the art that the present invention may be also applicable to a fixed terminal such as a digital TV and a desktop computer, except for specific configurations for mobility.

Figure 1:
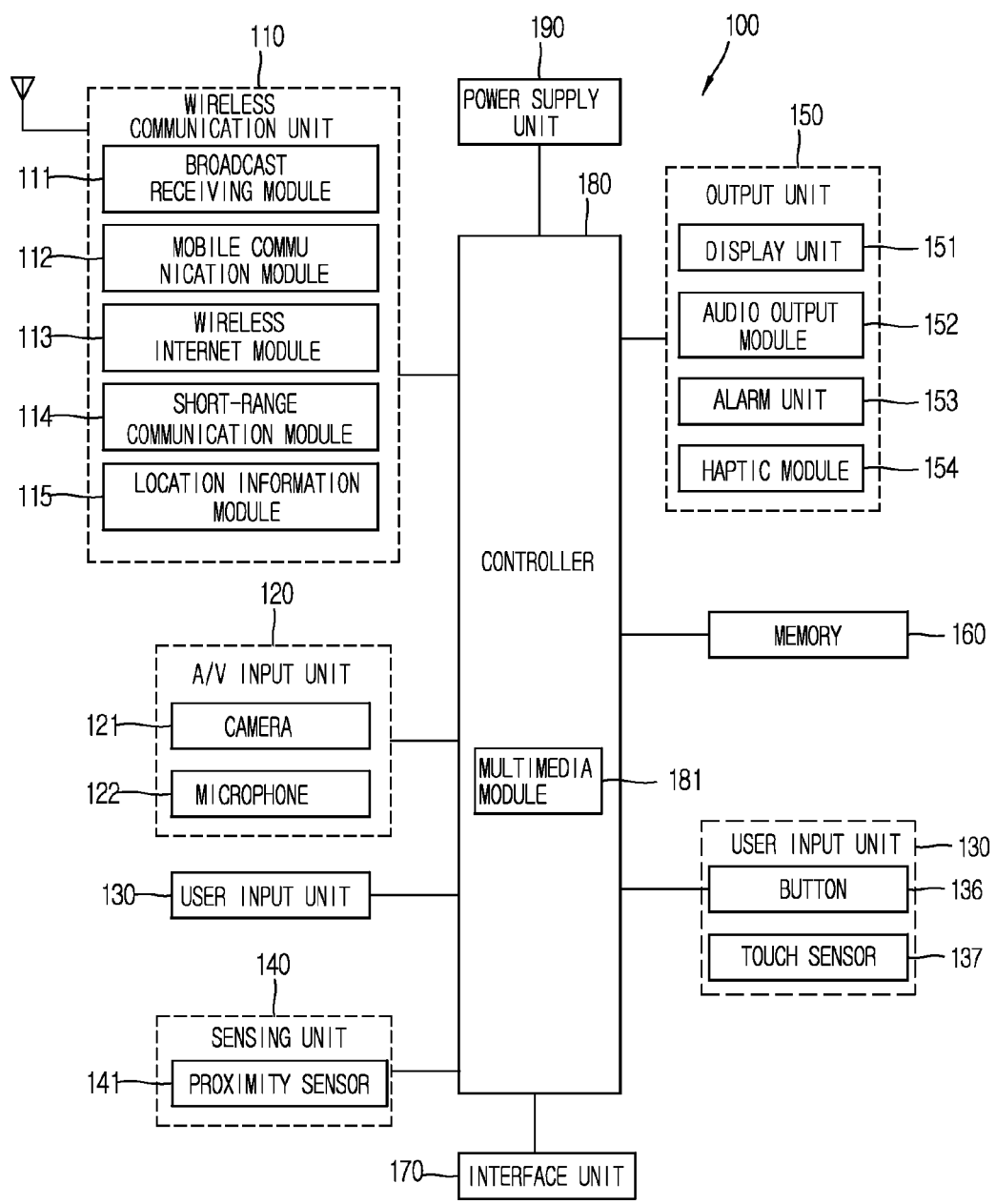
FIG. 1 is a block diagram of a mobile terminal according to an embodiment of the present invention.

FIG. 1 is a block diagram of a mobile terminal according to an embodiment of the present invention.

As shown in FIG. 1, the mobile terminal 100 includes a radio communication unit 110, an NV (Audio/Video) input unit 120, a user input unit 130, a sensing unit 140, an output unit 150, a memory 160, an interface unit 170, a controller 180, and a power supply unit 190. FIG. 1 shows the mobile terminal 100 having various components, but it is understood that implementing all of the illustrated components is not a requirement. The mobile terminal 100 may be implemented by greater or fewer components.

Hereinafter, each of the above components will be explained.

The radio communication unit 110 typically includes one or more components to authorize radio communication between the mobile terminal 100 and a radio communication unit system or a network in which the mobile terminal 100 is located. For example, the radio communication unit 110 may include a broadcast receiving module 111, a mobile communication module 112, a wireless Internet module 113, a short range communication module 114, a location information module 115, etc.

The broadcast receiving module 111 receives broadcast signals and/or broadcast associated information from an external broadcast management server (or other network entity) via a broadcast channel. The broadcast channel may include a satellite channel and/or a terrestrial channel. The broadcast receiving module 111 may be provided at the mobile terminal 100 in two or more, for simultaneous reception with respect to two or more broadcast channels, or for switching of broadcast channels.

The broadcast associated information may refer to information associated with a broadcast channel, a broadcast program or a broadcast service provider. The broadcast associated information may also be provided via a mobile communication network. In this case, the broadcast associated information may be received by the mobile communication module 112. Broadcast signals and/or broadcast-associated information received via the broadcast receiving module 111 may be stored in the memory 160.

The mobile communication module 112 transmits and/or receives radio signals to and/or from at least one of a base station, an external terminal and a server, in a mobile communication network such as a global system for mobile communications (GSM), a code division multiple access (CDMA), and a wideband CDMA (WCDMA). Such radio signals may include a voice call signal, a video call signal or various types of data according to text and/or multimedia message transmission and/or reception.

The wireless Internet module 113 supports wireless Internet access for the mobile communication terminal. This module may be internally or externally coupled to the mobile terminal 100. Here, as the wireless Internet technique, a wireless local area network (WLAN), Wi-Fi, wireless broadband (WiBro), world interoperability for microwave access (WiMAX), high speed downlink packet access (HSDPA), GSM, CDMA, WCDMA, long term evolution (LTE) and the like, may be used.

From a perspective view that wireless Internet connection based on Wibro, HSDPA, GSM, CDMA, WCDMA, LTE, etc. is performed via a mobile communication network, the wireless Internet module 113, which is configured to perform wireless Internet connection via the mobile communication network, may be understood as a sort of the mobile communication module 112.

The short range communication module 114 is a module for supporting short range communications. Some examples of short range communication technology include Bluetooth™, Radio Frequency IDentification (RFID), Infrared Data Association (IrDA), Ultra-WideBand (UWB), ZigBee™, and the like.

The location information module 115 is a module for acquiring a location (or position) of the mobile communication terminal. For example, the location information module 115 may include a GPS (Global Positioning System) module. Under the current technique, the GPS module can measure accurate time and distance respectively from more than three satellites so as to accurately calculate a current position of the mobile terminal based on such three different distances according to a triangulation scheme. A scheme may be used to obtain time information and distance information from three satellites and correct error by one satellite. Also, the GPS module may continuously calculate a current position in real time so as to obtain speed information.

Referring to FIG. 1, the A/V input unit 120 is configured to receive an audio or video signal. The NV input unit 120 may include a camera 121 and a microphone 122. The camera 121 processes image data of still pictures or video acquired by an image capture device in a video capturing mode or an image capturing mode. The processed image frames may be displayed on a display 151.

The image frames processed by the camera 121 may be stored in the memory 160 or transmitted via the radio communication unit 110. Two or more cameras 121 may be provided according to the configuration of the mobile communication terminal.

The microphone 122 may receive sounds (audible data) via a microphone in a phone call mode, a recording mode, a voice recognition mode, and the like, and can process such sounds into audio data. The processed audio (voice) data may be converted for output into a format transmittable to a mobile communication base station via the mobile communication module 112 in case of the phone call mode. The microphone 122 may implement various types of noise canceling (or suppression) algorithms to cancel (or suppress) noise or interference generated in the course of receiving and transmitting audio signals.

The user input unit 130 may generate key input data from commands entered by a user to control various operations of the mobile communication terminal. The user input unit 130 may comprise a button 136 disposed on a front surface, a rear surface or a side surface of the mobile terminal 100, and a touch sensor 137 (a touch sensitive member that detects changes in pressure, capacitance, etc.). Although not shown, the user input unit 130 may comprise a keypad, a dome switch, a jog wheel, a jog switch, and the like.

The sensing unit 140 detects a current status (or state) of the mobile terminal 100 such as an opened or closed state of the mobile terminal 100, a location of the mobile terminal 100, the presence or absence of a user's touch (contact) with the mobile terminal 100 (e.g., touch inputs), the orientation of the mobile terminal 100, an acceleration or deceleration motion and direction of the mobile terminal 100, etc., and generates commands or signals for controlling the operation of the mobile terminal 100. For example, when the mobile terminal 100 is configured as a slide type mobile phone, the sensing unit 140 may sense whether the slide phone is opened or closed. In addition, the sensing unit 140 can detect whether or not the power supply unit 190 supplies power or whether or not the interface unit 170 is coupled with an external device. The sensing unit 140 may comprise a proximity sensor 141. The proximity sensor 141 will be later explained.

The output unit 150 is configured to provide outputs in a visual, audible, and/or tactile manner (e.g., audio signal, video signal, alarm signal, vibration signal, etc.). The output unit 150 may include the display 151, an audio output module 152, an alarm unit 153, a haptic module 154, and the like.

The display 151 may display information processed in the mobile terminal 100. For example, when the mobile terminal 100 is in a phone call mode, the display 151 may display a User Interface (UI) or a Graphic User Interface (GUI) associated with a call. When the mobile terminal 100 is in a video call mode or image capturing mode, the display 151 may display a captured image and/or received image, a UI or GUI.

The display 151 may include at least one of a Liquid Crystal Display (LCD), a Thin Film Transistor-LCD (TFT-LCD), an Organic Light Emitting Diode (OLED) display, a flexible display and a three-dimensional (3D) display.

The display 151 may be implemented in two or more in number according to a configured aspect of the mobile terminal 100. For instance, a plurality of displays may be arranged on one surface integrally or separately, or may be arranged on different surfaces.

Here, if the display 151 and the touch sensor 137 have a layered structure therebetween, the structure may be referred to as a touch screen. The display 151 may be used as an input device rather than an output device. The touch sensor 137 may be configured as a touch film, a touch sheet, a touch pad, and the like. In this case, the touch sensor 137 may be disposed on the display 151 to form a layered structure, or may be integrated with the display 151.

The touch sensor 137 may be configured to convert changes of a pressure applied to a specific part of the display 151, or a capacitance occurring from a specific part of the display 151, into electric input signals. Also, the touch sensor 137 may be configured to sense not only a touched position and a touched area of a touch object, but also a touch pressure.

When touch inputs are sensed by the touch sensor 137, corresponding signals are transmitted to a touch controller (not shown). The touch controller processes the received signals, and then transmits corresponding data to the controller 180. Accordingly, the controller 180 may sense which region of the display 151 has been touched.

The audio output module 152 may output audio data received from the radio communication unit 110 or stored in the memory 160 in a call signal reception mode, a call mode, a record mode, a voice recognition mode, a broadcast reception mode, and the like. Also, the audio output module 152 may provide audible outputs related to a particular function (e.g., a call signal reception sound, a message reception sound, etc.) performed in the mobile terminal 100. The audio output module 152 may include a receiver, a speaker, a buzzer, etc.

The alarm unit 153 outputs a signal for informing about an occurrence of an event of the mobile terminal 100. Events generated in the mobile terminal may include call signal reception, message reception, key signal inputs, and the like. In addition to video or audio signals, the alarm unit 153 may output signals in a different manner, for example, to inform about an occurrence of an event. For example, the alarm unit 153 may output a signal in the form of vibration. The video signal or audio signal may be output through the display 151 or the voice output module 152. Therefore, the display 151 and the voice output module 152 may be categorized as part of the alarm unit 153.

The haptic module 154 generates various tactile effects the user may feel. A typical example of the tactile effects generated by the haptic module 154 is vibration. The strength and pattern of the haptic module 154 can be controlled. For example, different vibrations may be combined to be output or sequentially output.

The memory 160 may store software programs used for the processing and controlling operations performed by the controller 180, or may temporarily store data (e.g., a map data, phonebook, messages, still images, video, etc.) that are input or output. The memory 160 may store a usage frequency with respect to the respective data (e.g., a usage frequency with respect to each telephone number, each message, and each multimedia).

The memory 160 may store data relating to various patterns of vibrations and sounds output when touch input to the touch screen is sensed.

The interface unit 170 serves as an interface with every external device connected with the mobile terminal 100. For example, the external devices may transmit data to an external device, receives and transmits power to each element of the mobile terminal 100, or transmits internal data of the mobile terminal 100 to an external device. For example, the interface unit 170 may include wired or is wireless headset ports, external power supply ports, wired or wireless data ports, memory card ports, ports for connecting a device having an identification module, audio input/output (I/O) ports, video I/O ports, earphone ports, or the like.

Here, the identification module may be a chip that stores various information for authenticating the authority of using the mobile terminal 100 and may include a user identity module (UIM), a subscriber identity module (SIM) a universal subscriber identity module (USIM), and the like. In addition, the device having the identification module (referred to as 'identifying device', hereinafter) may take the form of a smart card. Accordingly, the identifying device may be connected with the terminal 100 via the interface unit 170.

When the mobile terminal 100 is connected with an external cradle, the interface unit 170 may serve as a passage to allow power from the cradle to be supplied therethrough to the mobile terminal 100 or may serve as a passage to allow various command signals input by the user from the cradle to be transferred to the mobile terminal therethrough. Various command signals or power input from the cradle may operate as signals for recognizing that the mobile terminal is properly mounted on the cradle.

The controller 180 typically controls the general operations of the mobile terminal. For example, the controller 180 performs controlling and processing associated with voice calls, data communications, video calls, and the like. The controller 180 may include a multimedia module 181 for reproducing multimedia data. The multimedia module 181 may be configured within the controller 180 or may be configured to be separated from the controller 180.

The controller 180 may perform a pattern recognition processing to recognize a handwriting input or a picture drawing input performed on the touch is screen as characters or images, respectively.

The power supply unit 190 receives external power or internal power and supplies appropriate power required for operating respective elements and components under control of the controller 180. The power supply unit 190 may comprise a battery, a connection port, a power supply controller and a charging monitoring unit.

The battery may be configured as an internal battery for charging, and may be detachably coupled to the terminal body for charging. The connection port may be configured as an example of the interface 170 to which an external charger is electrically connected, the external charger for supplying power to the mobile terminal so as to charge the battery.

Various embodiments described herein may be implemented in a computer-readable or its similar medium using, for example, software, hardware, or any combination thereof.

Figure 2:
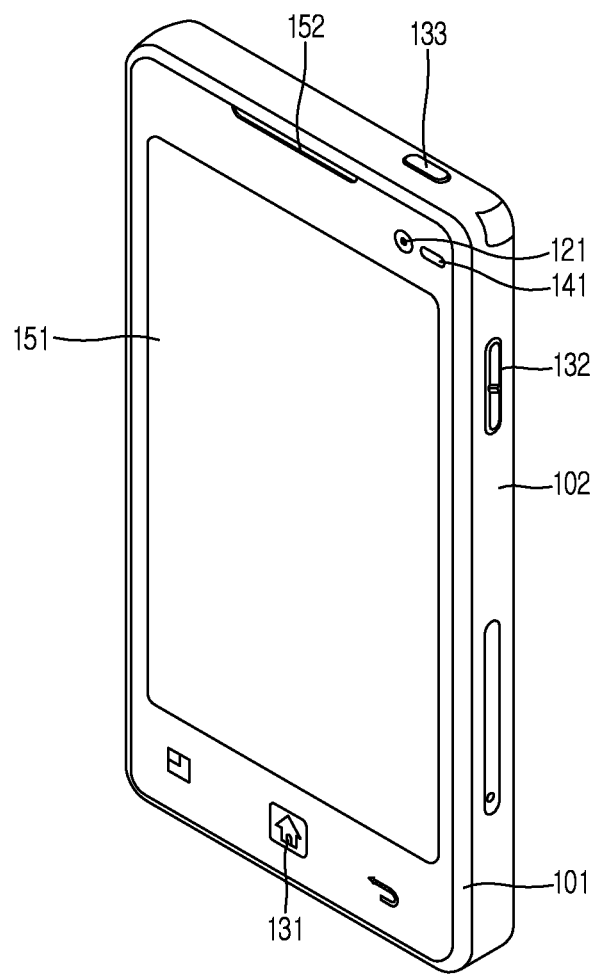
FIG. 2 is a front perspective view of a mobile terminal according to an embodiment of the present invention.

FIG. 2 is a front perspective view of a mobile terminal according to an embodiment of the present invention.

The mobile terminal 100 according to the present disclosure is a bar type mobile terminal. However, the present disclosure is not limited to this, but may be applied to a slide type in which two or more bodies are coupled to each other so as to perform a relative motion, a folder type, or a swing type, a swivel type and the like.

A body of the mobile terminal 100 comprises a case. The case may be divided into a front case 101 and a rear case 102. A space formed by the front case 101 and the rear case 102 may accommodate various components therein.

In some cases, electronic components may be mounted to the surface of is the rear case 102. The electronic components mounted to the surface of the rear case 102 may comprise a battery, a USIM card, a memory card, etc. each detachable from the rear case 102 by a user. The rear case 102 may be further provided with a rear cover for covering the surface of the rear case 102. The rear cover is formed so as to be easily detachably-mounted to the rear case. If the rear cover is removed from the rear case 102, the surface of the rear case 102 is exposed to outside.

Such cases 101 and 102 may be formed by injection-molded synthetic resin, or may be formed using a metallic material such as stainless steel (STS) or titanium (Ti).

At the cases 101 and 102, may be disposed a display 151, an audio output unit 152, a camera 121, user input units 130/131 and 132, a microphone 122, an interface unit 170, etc.

The display 151 occupies most parts of a main surface of the front case 101. The audio output unit 152 and the camera 121 are arranged at a region adjacent to one end of the stereoscopic display 151, and the user input unit 131 and the microphone 122 are arranged at a region adjacent to another end of the display 151. The user input unit 132, the interface unit 170, etc. may be arranged on side surfaces of the front case 101 and the rear case 102.

The user input unit 130 is manipulated to receive a command for controlling the operation of the mobile terminal 100, and may include a plurality of manipulation units 131, 132 and 133. The manipulation units may be referred to as manipulating portions.

Commands inputted through the first or second user input units 131 and 132 may be variously set. For instance, the first manipulation unit 131 is configured to input commands such as START, END, SCROLL or the like, and the second manipulation unit 132 is configured to input commands for controlling a level of sound outputted from the audio output unit 152. The third manipulation unit 133 is configured to input a command such as activating/deactivating a touch recognition mode of the display 151.

The manipulation units 131, 132 and 133 may be implemented as buttons configured to recognize a user's pressure. Alternatively, the touch sensor 137 may be provided at the manipulation units 131, 132 and 133, as well as the display 151, so that a user's command input in a touch manner can be recognized.

Figure 3:
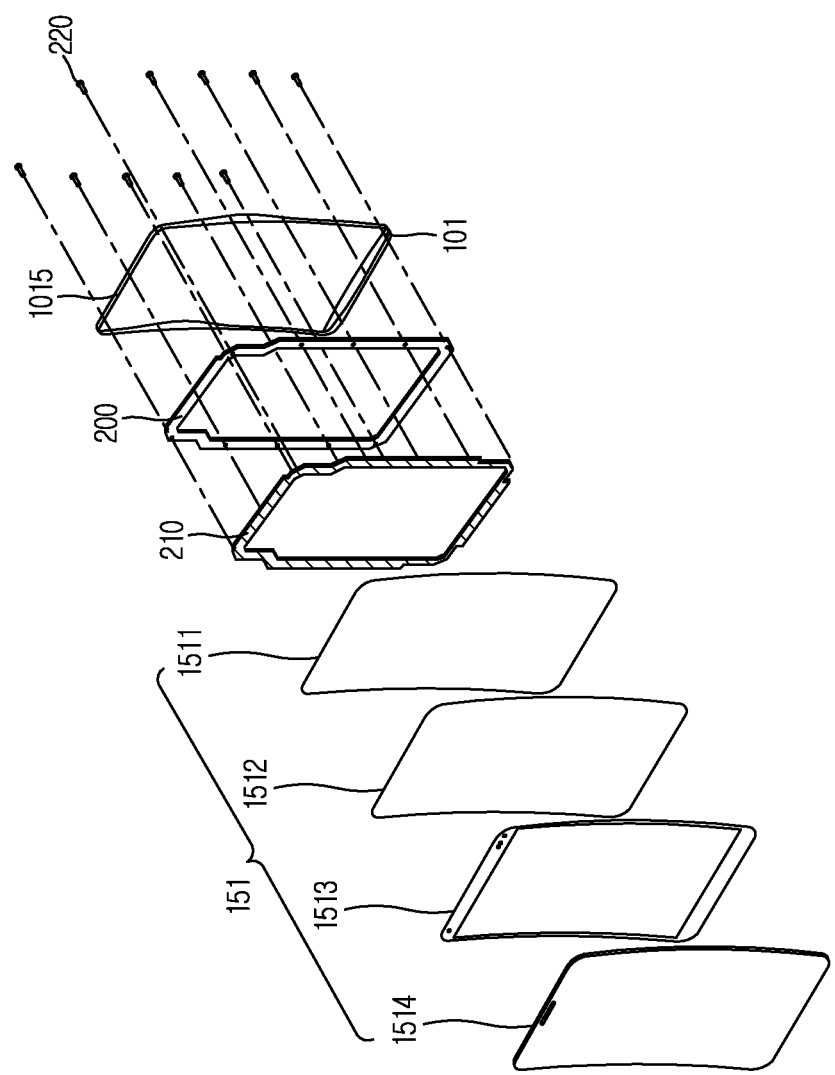
FIG. 3 is a disassembled perspective view of a display and a front case of a mobile terminal according to an embodiment of the present invention.

FIG. 3 is a disassembled perspective view of the display 151 and the front case 101 of the mobile terminal according to an embodiment of the present invention. FIG. 3 illustrates the display 151, an adhesive tape 210, a metal frame 200, the front case 101 and a screw 220.

The mobile terminal of the present invention may be applicable to a straight-bar type mobile terminal of FIG. 2. As shown in FIG. 3, the display 151 may be a flexible display. The metal frame 200 and the front case 101, which are attached to the rear surface of the flexible display 151, have a bent shape in correspondence to the display 151.

The display 151 is disposed to output visual information to the front surface of the terminal body. To this end, the display 151 may comprise a display panel 1511, a touch panel 1512, a window glass 1513 and a protection film 1514. Alternatively, the display 151 may comprise the display panel 1511 and the window glass 1513. Still alternatively, the display 151 may comprise only the display panel 1511 without the window glass 1513. As aforementioned, the display panel 1511, a device configured to output images, may be configured as a liquid is crystal display, a thin film transistor, an organic light emitting diode, etc.

The touch panel 1512, which is positioned on the front surface of the display panel 1511, is provided with a touch sensor 137. The touch panel 1512 is configured to convert a user's touch into an electric signal, and to transmit the electric signal to the controller. The window glass 1513 implements a non-display region where an image is not output, by forming a printing layer on an edge region of a transparent member such as glass or plastic.

A reinforcing member may be additionally attached to the front surface of the window glass 1513, for protection of the window glass 1513. The reinforcing member serves to prevent damage of the display 151.

Recently, a display panel is directly attached to a front case without an additional fixing structure. In the conventional art, in order to couple a display panel to a front case, an edge region of the front surface of a window glass is coupled to the front case. Then, the display panel is attached to the rear surface of the window glass, by applying an adhesive tape to an edge region of the display panel.

In the conventional structure, a bezel portion should have a prescribed size or more than so that the display panel can be stably fixed to the front case. However, since the size of the bezel portion which covers an edge region of the display panel is gradually reduced, it is difficult to obtain an adhesive force between the display panel and the front case. Therefore, a method for directly attaching the rear surface of the display panel to the front case may be adopted.

However, if a user wishes to separate the display panel from the front case for repair of the mobile terminal, in a state where the display panel and the front case are attached to each other by an adhesive tape, the end of the display panel is may be bent due to an adhesive force of the adhesive tape. This may result in damage of the display panel.

In order to solve such problems, the present invention provides a frame 200. The frame 200 is coupled to the rear surface of the display 151, and is integrated with the display 151 by adhesion. The frame 200 is detachably coupled to the case so that the display 151 can be fixed to or separated from the case. The case may be configured as a front case. However, the present invention is not limited to this. For instance, the case may be configured as an intermediate case disposed between a front case and a rear case.

Figure 4:
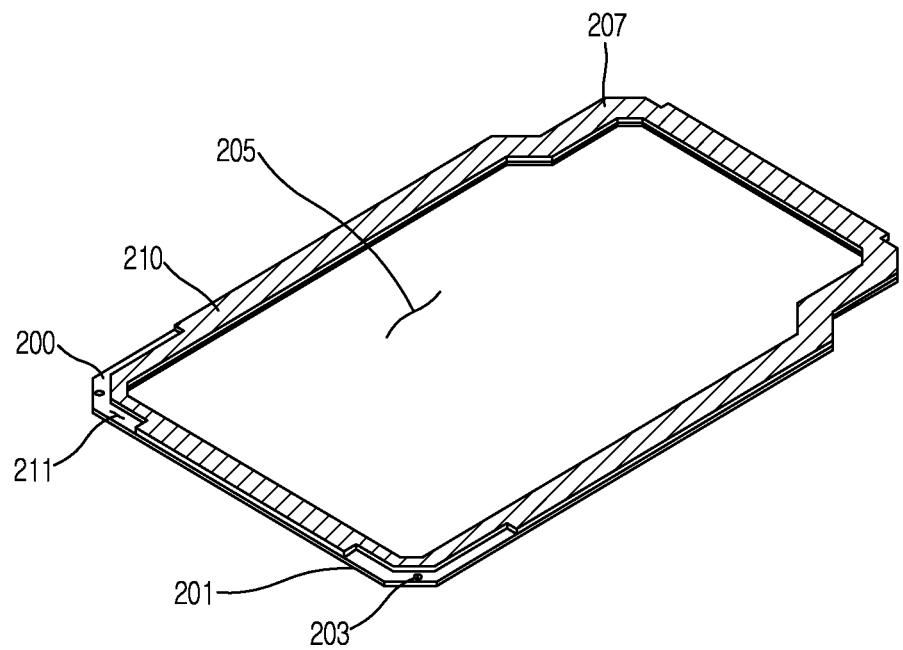
FIG. 4 is a front perspective view of a metal frame of a mobile terminal according to an embodiment of the present invention.

The frame 200 is positioned on the rear surface of the display 151, and is coupled to the display 151 by an adhesive tape 210. Alternatively, the frame 200 may be coupled to the display 151 by an adhesive, etc. FIG. 4 illustrates an attached state of the adhesive tape 210 to the frame 200. The frame 200 is formed along the edge of the display 151. More specifically, the frame 200 is formed in a ring shape (or belt shape) along the edge of the display 151, so that an opening 205 can be formed at a central part thereof.

The frame 200 may be configured as a plate having no opening 205. Since the front case 101 and the display 151 are coupled to each other only on the edge of the display 151, the opening 205 may be formed as shown in FIG. 4. Under such configuration, unnecessary waste of material can be prevented, and the weight of the mobile terminal can be reduced. Further, the empty space can be more utilized due to the opening 205.

The frame 200 may be formed as corner regions 207 thereof are partially inwardly transformed. The front case 101 may have a double injection structure where plastic is injection-molded to a metallic member. In this case, it is easy to is insert the screw 220 to part of the front case 101 where an injection-molded material is positioned. Accordingly, the frame 200 may be formed at the front case 101 where an injection-molded material is positioned, not at part of the front case 101 formed of a metallic material.

More specifically, the front case 101 (refer to FIG. 6) is provided with an accommodation portion 101a (refer to FIG. 6) for accommodating the display therein. The frame is fixed to the case, using a screw coupled to the rear surface of the frame via one surface (bottom surface) of the accommodation portion. The front case is provided with an outer part forming a side appearance of the mobile terminal, and an inner part extending from the outer part toward inside of the mobile terminal (i.e., toward a direction perpendicular to the side surface of the mobile terminal). The inner part forms a bottom surface of the accommodation portion.

In this embodiment, the metal frame 200 is detachably coupled to the case by screw-coupling. However, the present invention is not limited to this. For instance, the metal frame 200 may be coupled to the case in a fitting manner, e.g., by hook-coupling.

In a case where the mobile terminal is provided, at a corner region thereof, with a fixing structure for fixing a printed circuit board positioned on the rear surface of the front case 101, the thickness of the front case 101 may be partially increased. If the frame 200 is positioned at the thick region of the front case 101, the thickness of the front case 101 may be more increased. Therefore, the frame 200 may be formed at any region of the front case 101 rather than the thick region.

That is, the frame 200 is formed along the edge of the rear surface of the display 151, in a prescribed shape. The prescribed shape is not limited to a is rectangular shape, but may be a partially-bent shape corresponding to the shape of the front case 101.

The adhesive tape 210 coupled to the frame 200 may not have the same shape as the frame 200, but may have its corner regions partially removed. The corner regions 211, onto which the adhesive tape 210 has not been attached, provide a user's holding (gripping) region so that the frame 200 can be easily separated from the display panel 1511.

If the frame 200 is entirely attached to the display panel 1511, the frame 200 cannot be easily separated from the display panel 1511, because a user has a difficulty in holding (gripping) the frame 200. If a user holds the corner regions 211 having the adhesive tape 210 removed therefrom, the frame 200 can be easily separated from the display panel 1511 while being bent in the form of a thin metallic member.

In case of separating the display panel 1511 attached to the front case 101 by the adhesive tape 210 from the front case 101, the front case 101 is not bent because it is a hard injection-molded material. The case should be formed to have a proper thickness, in order to protect inner components of the mobile terminal while forming the appearance of the terminal body. Therefore, the case is not easily bent even in a state where the front case 101 is formed of a metallic material. Since both of the display panel 1511 and the front case 101 are formed of a hard material, the display panel 1511 is bent to be damaged, unless both of the adhesive tape 210 and the display panel 1511 are simultaneously separated from the front case 101.

In this embodiment, the frame 200 is formed to have rigidity smaller than that of at least one of the display 151 and the front case 101. For instance, the is frame 200 is implemented in the form of a thin plate, and is formed of a metallic material for low rigidity and proper intensity. Accordingly, the frame 200 may be a metal frame (hereinafter, will be referred to as a metal frame). However, the present invention is not limited to this. For instance, the frame may be formed of carbon fiber for low rigidity and proper intensity, etc.

In case of using the metal frame 200 which can be bent, rather than positioning the adhesive tape 210 between the front case 101 and the display panel 1511, the display 151 is not damaged when the display 151 having the adhesive tape 210 attached thereto is separated from the front case 101.

Figure 5:
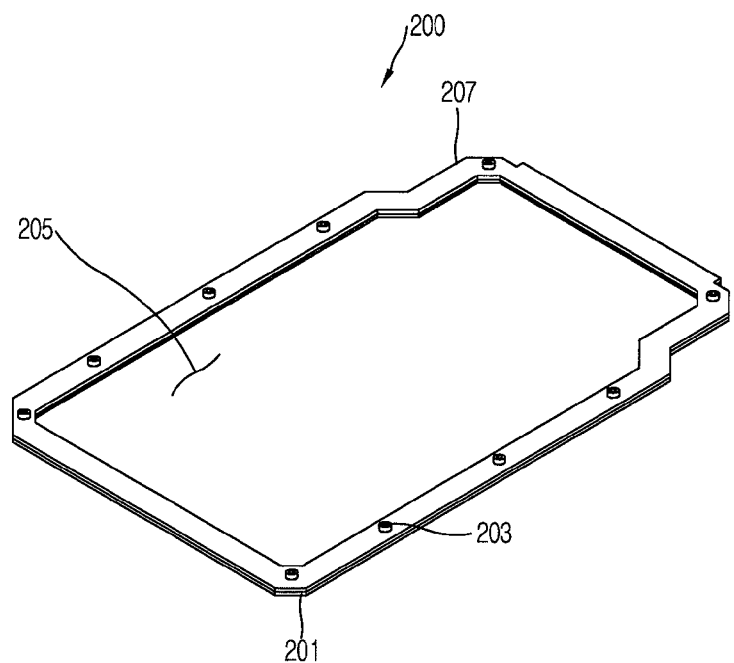
FIG. 5 is a perspective view illustrating a rear surface of the metal frame in FIG. 4.
Figure 6:
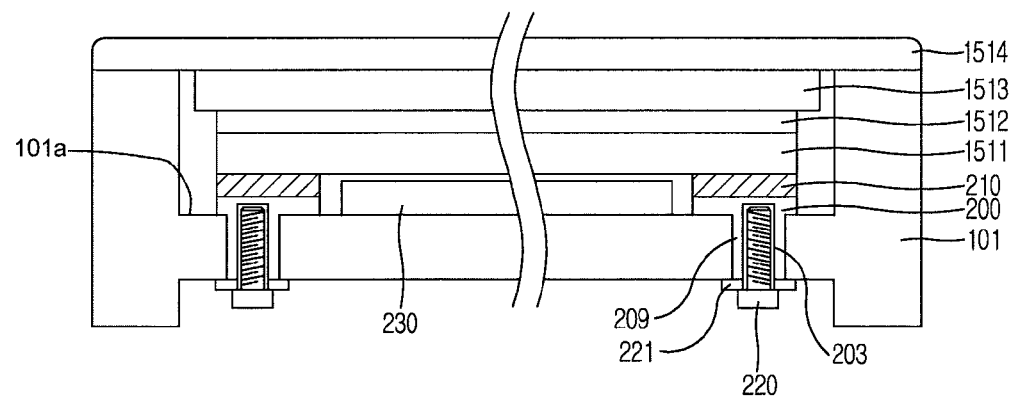
FIG. 6 is a sectional view of a display coupled to a front case of a mobile terminal according to an embodiment of the present invention.
Figure 7:
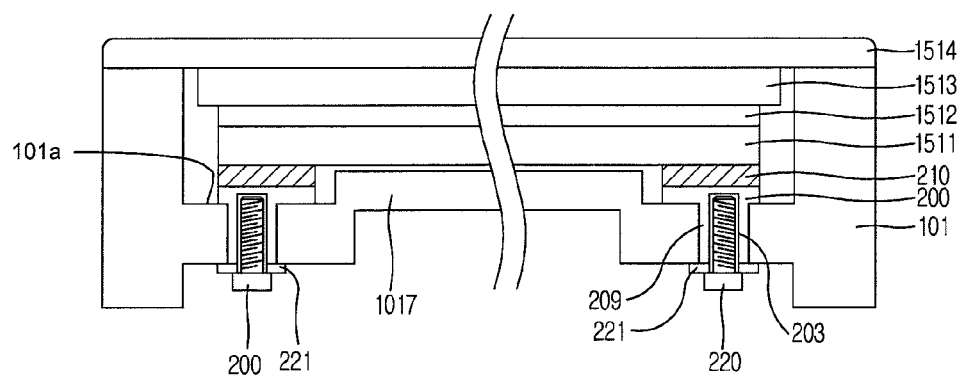
FIG. 7 is a sectional view of a display coupled to a front case of a mobile terminal according to another embodiment of the present invention.

FIG. 5 is a perspective view illustrating the rear surface of the metal frame 200 in FIG. 4, which illustrates screw-coupling grooves 203 formed on the rear surface of the metal frame 200. The screw-coupling grooves 203 are formed along the edge of the metal frame 200. As shown, the metal frame 200 may further comprise boss portions 209 protruding from a circumferential surface of the screw-coupling grooves 203, toward the rear surface of the metal frame 200. Since the metal frame 200 has a small thickness, the screw 220 cannot be inserted into the metal frame 200. Accordingly, the boss portions 209 are protruded from the edge of the screw-coupling grooves 203. Under such configuration, the thickness of the metal frame 200 is increased so that the screw 220 can be inserted into the screw-coupling grooves 203. As shown in FIGS. 6 and 7, at least part of the boss portion 209 can be inserted into a screw-coupling hole 1015 of the front case 101.

In order to prevent the metal frame 200 and the front case 101, which are coupled to each other by the screw 200, from being separated from each other, a washer 221 may be inserted into the screw 220 before the screw 220 is inserted into the screw-coupling groove 203. The washer 221 may not be used in a case is where a head of the screw 220 is larger than the screw-coupling hole 1015 of the front case 101.

FIG. 6 is a sectional view of the display 151 coupled to the front case 101 of the mobile terminal according to an embodiment of the present invention. Referring to FIG. 6, a graphite sheet 230 is inserted into the opening 205 formed at a central part of the metal frame 200. The graphite sheet 230, a radiating material, may serve to radiate heat by rapidly spreading heat emitted from the display panel 1511. That is, a radiating sheet is disposed at the opening 205 to accelerate radiation of heat from the display panel. The radiating sheet may be formed of not only graphite, but also other materials.

FIG. 7 is a sectional view of the display 151 coupled to the front case 101 of a mobile terminal according to another embodiment of the present invention. Referring to FIG. 7, part 1017 of the front case 101, which corresponds to the opening 205 of the metal frame 200, protrudes toward the front surface of the metal frame 200.

As the part 1017 partially protrudes toward the front surface of the metal frame 200, a space can be implemented in the rear surface of the front case 101. Further, various types of components, such as a printed circuit board, may be disposed at the space. This can enhance spatial utilization.

The metal frame 200 may be configured to be electrically connected to the display 151 partially or wholly, as the adhesive tape 210 includes a conductive material therein.

As the metal frame 200 is electrically connected to the printed circuit board (PCB) positioned on the rear surface of the front case 101, static electricity applied to the display 151 can be discharged to the PCB through the metal frame 200. The metal frame 200 and the PCB may be electrically connected to each other using the screw 220.

The present invention can have the following advantages.

Firstly, according to at least one embodiment of the present invention, the rear surface of the display 151 can be coupled to the case. This can prevent increment of the size of a bezel portion disposed on the side surface of the mobile terminal.

Further, the display 151 is fixed to the front case 101 using a structure of the metal frame 200 and the screw 220. This can allow a coupling force between the display 151 and the front case 101 to be obtained, and can allow the display 151 to be easily separated from the front case 101 during a repair process of the mobile terminal.

Figure 8:
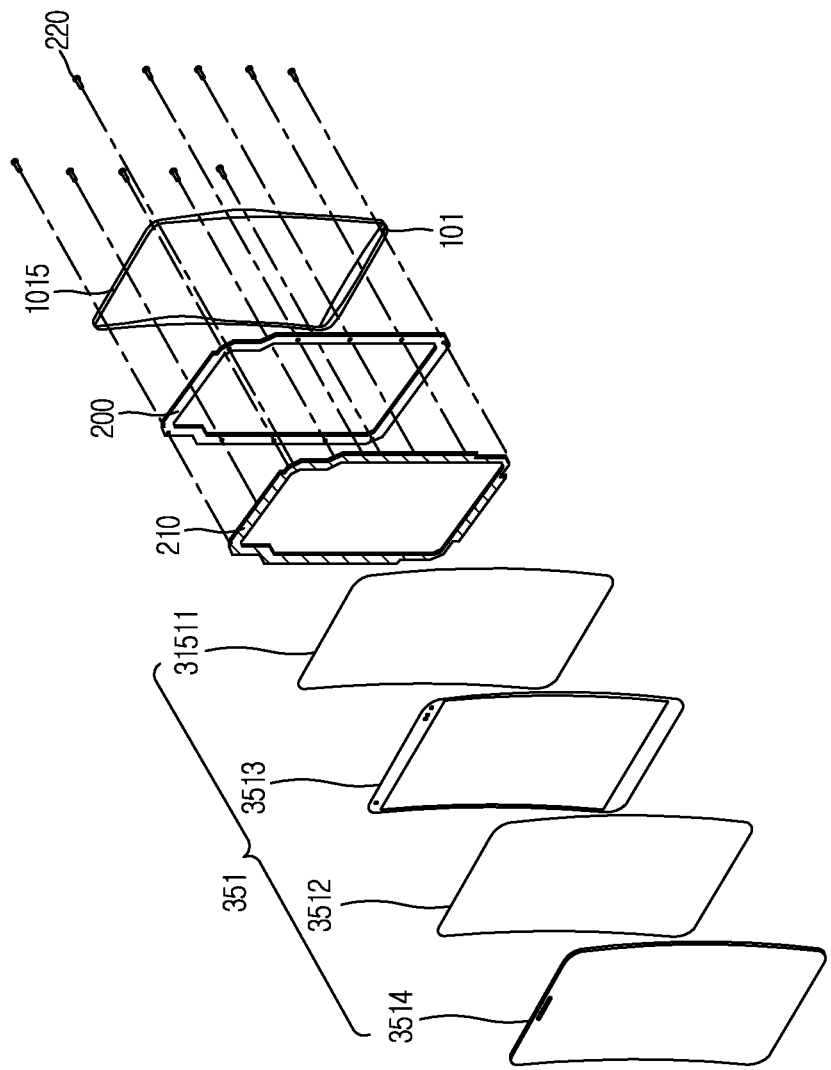
FIG. 8 is an exploded perspective view of a display 351 and a front case 101 of a mobile terminal according to another embodiment of the present invention.

FIG. 8 is an exploded perspective view of a display 351 and the front case 101 of a mobile terminal according to another embodiment of the present invention. FIG. 3 illustrates the display 151, the adhesive tape 210, the metal frame 200, the front case 101 and the screw 220.

FIG. 8 illustrates the display 351 as a modification structure of the display 151. Hereinafter, the same components as those of FIG. 3 will not be explained, but only the display 351 will be explained.

The display 351 is disposed to output visual information to a front surface of the terminal body. For this, the display 351 may include a display panel 3511, a touch panel 3512, a window glass 3514 and a transparent film 3513.

In this case, the display panel 3511, which serves as an image outputting apparatus as aforementioned, may be implemented as a liquid crystal display, a thin film transistor, an organic light emitting diode, etc.

The window glass 3514 may be formed of a transparent member such as glass or plastic. The transparent film 3513 may be an optically clear adhesive (OCA) film. Ink may be printed onto an edge region of the transparent film 3513, so that a printed layer can be formed.

The touch panel 3512 may be adhered to a rear surface of the window glass 3514, and the transparent film 3513 may be disposed to cover the touch panel 3512. However, the present invention is not limited to this. That is, the touch panel 3512 may be integrally formed with the display panel 3511 to thus form a touch display panel.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the to foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A mobile terminal, comprising:
a display having a display panel, the display panel having an upper surface facing an exterior of the mobile terminal, a lower surface opposite the upper surface, and side surfaces extending between the upper surface and the lower surface;
a metal frame coupled to a rear surface of the display by an adhesive tape, and having a screw-coupling groove on a rear surface thereof;
a front case coupled to the rear surface of the metal frame, and having a screw-coupling hole;
a screw inserted into the screw-coupling groove and the screw-coupling hole on a rear surface of the front case; and
a rear case coupled to the front case, and configured to cover the rear surface of the metal frame,
wherein the metal frame is provided with an opening at a central part thereof,
wherein the front case is provided with a protruding portion having a front surface protruding in correspondence to a shape of the opening,
wherein the protruding portion is inserted into the opening, and
wherein the adhesive tape includes a conductive material such that the metal frame is electrically connected to the display and the metal frame is electrically connected to a printed circuit board (PCB) positioned on the rear surface of the front case by the screw.

2. The mobile terminal of claim 1, wherein the metal frame further comprises a boss portion protruding from a circumferential surface of the screw-coupling groove toward the rear surface of the metal frame, and the boss portion inserted into the screw-coupling hole of the front case.

3. The mobile terminal of claim 1, wherein a graphite sheet is inserted into the opening.

4. The mobile terminal of claim 1, wherein the metal frame is formed as at least one corner region thereof is cut-out.

5. The mobile terminal of claim 1, wherein the screw-coupling hole and the screw-coupling groove are formed along an edge region of the display.

6. The mobile terminal of claim 1, wherein the printed circuit board is disposed between the front case and the rear case.

7. The mobile terminal of claim 1, wherein the display is configured as an organic light emitting diode (OLED).

8. The mobile terminal of claim 1, wherein the display is bent in the form of a curved line, and
wherein the front case, the rear case and the metal frame are bent in correspondence to the shape of the display.

9. A mobile terminal, comprising:
a terminal body;
a display configured to output visual information to a front surface of the terminal body, the display having a display panel, the display panel having an upper surface facing an exterior of the mobile terminal, a lower surface opposite the upper surface, and side surfaces extending between the upper surface and the lower surface;
a metal frame coupled to a rear surface of the display, and integrated with the display by an adhesive tape; and
a case forming an appearance of the terminal body partially or wholly, and to which the frame is detachably coupled such that the display is fixed to or separated from the case,
wherein the metal frame is provided with an opening at a central part thereof,
wherein the case is provided with a protruding portion having a front surface protruding in correspondence to a shape of the opening,
wherein the protruding portion is inserted into the opening, and
wherein the adhesive tape includes a conductive material such that the metal frame is electrically connected to the display and the metal frame is electrically connected to a printed circuit board (PCB) positioned on the rear surface of the case.

10. The mobile terminal of claim 9, wherein the case is provided with an accommodation portion for accommodating the display therein, and
wherein the frame is fixed to the case, using a screw coupled to the rear surface of the frame via one surface of the accommodation portion.

11. The mobile terminal of claim 10, wherein a boss portion protrudes from the rear surface of the frame, and
wherein the screw-coupling groove is formed at the boss portion.

12. The mobile terminal of claim 11, wherein a screw-coupling hole is formed at the case, and
wherein the boss portion is partially or wholly inserted into the screw-coupling hole.

13. The mobile terminal of claim 9, further comprising a radiating sheet disposed at the opening, and configured to accelerate radiation of heat from the rear surface of the display.

14. The mobile terminal of claim 9, wherein the case comprises:
an accommodation portion configured to accommodate the display therein; and
a protruding portion protruding from one surface of the accommodation portion, and inserted into the opening.

* * * * *